(12) United States Patent
Hofmann et al.

(10) Patent No.: US 6,979,859 B2
(45) Date of Patent: Dec. 27, 2005

(54) FLASH MEMORY CELL AND FABRICATION METHOD

(75) Inventors: Franz Hofmann, Munich (DE); Michael Specht, Munich (DE)

(73) Assignee: Infenion Technologies AG, Munich (DE)

( * ) Notice: Subject to any disclaimer, the term of this patent is extended or adjusted under 35 U.S.C. 154(b) by 0 days.

(21) Appl. No.: 10/991,342

(22) Filed: Nov. 9, 2004

(65) Prior Publication Data
US 2005/0146940 A1 Jul. 7, 2005

Related U.S. Application Data

(63) Continuation of application No. PCT/DE03/01488, filed on May 9, 2003.

(30) Foreign Application Priority Data
May 10, 2002 (DE) ................................ 102 20 922

(51) Int. Cl.[7] ..................... H01L 29/788; H01L 21/336

(52) U.S. Cl. ..................................... 257/315; 438/259

(58) Field of Search ......... 438/254–266; 257/314–326

(56) References Cited

U.S. PATENT DOCUMENTS

| | | | |
|---|---|---|---|
| 5,315,142 A | 5/1994 | Acovic et al. | |
| 5,411,905 A | 5/1995 | Acovic et al. | |
| 5,633,519 A | 5/1997 | Yamazaki et al. | |
| 5,751,037 A | 5/1998 | Aozasa et al. | |
| 5,973,356 A | 10/1999 | Noble et al. | |
| 6,033,957 A * | 3/2000 | Burns et al. | 438/270 |
| 6,043,122 A | 3/2000 | Liu et al. | |
| 6,143,636 A * | 11/2000 | Forbes et al. | 257/315 |
| 6,198,125 B1 | 3/2001 | Yamazaki et al. | |
| 6,414,351 B2 * | 7/2002 | Clampitt et al. | 257/315 |
| 6,476,434 B1 * | 11/2002 | Noble et al. | 257/302 |
| 6,498,065 B1 * | 12/2002 | Forbes et al. | 438/259 |
| 6,548,856 B1 * | 4/2003 | Lin et al. | 257/315 |
| 6,760,252 B2 * | 7/2004 | Mikolajick | 365/185.01 |
| 6,878,991 B1 * | 4/2005 | Forbes | 257/328 |

* cited by examiner

*Primary Examiner*—Savitri Mulpuri
(74) *Attorney, Agent, or Firm*—Darby & Darby

(57) ABSTRACT

Memory cells, formed as trench transistors, having a respective floating gate electrode and a control gate electrode at a trench wall above a channel region between doped regions for source and drain are provided with a gate electrode arranged in a further trench, via which gate electrode the channel region present in a semiconductor ridge between the trenches can additionally be driven.

7 Claims, 4 Drawing Sheets

|       | Drain | CG-Gate | Tr-Gate | Source |
|-------|-------|---------|---------|--------|
| Prog  | 3 V   | 8 V     | 0       | 0      |
| Erase | 0     | -15 V   | 0       | 0 V    |
| Read  | 1 V   | 2.5 V   | 2 V     | 0      |

FLASH MEMORY CELL AND FABRICATION METHOD

CROSS-REFERENCE TO RELATED APPLICATION

This application is a continuation of International Patent Application Serial No. PCT/DE03/01488, filed May 9, 2003, which published in German on Nov. 20, 2003 as WO 03/096425, and is incorporated herein by reference in its entirety.

FIELD OF THE INVENTION

The present invention relates to a flash memory cell and a matrix arrangement of such memory cells as a semiconductor memory, and to an associated fabrication method.

BACKGROUND OF THE INVENTION

A flash memory cell has a transistor structure containing a floating gate electrode and a control gate electrode, which are isolated from the semiconductor material and from one another in each case by thin layers of a dielectric. When a suitable voltage is applied to the control gate electrode, charge carriers tunnel from the channel region of the transistor through the thin dielectric onto the floating gate electrode, as a result of which the memory cell is programmed. Since the threshold voltage of the transistor changes by virtue of the charge carriers on the floating gate electrode, the programmed state can be distinguished from the original state, i.e. the cell can be read. During the erasure process, the charge is removed from the floating gate electrode by oppositely applied potentials, so that the original (uncharged) state of the memory transistor is attained again, at least approximately. In the case of previous flash memory cells there are problems with the miniaturization of the transistors since the thickness of the tunnel oxide between the semiconductor material and the floating gate electrode cannot be reduced below 8 nm for reasons of adequate data retention. A scaled miniaturization of this transistor with the thickness of the gate oxide remaining the same is not possible.

SUMMARY OF THE INVENTION

It is an object of the present invention to specify a flash memory cell which, despite smaller dimensions, has a performance comparable to conventional flash memory cells. In addition, the intention is to specify an associated fabrication method.

The flash memory cell has a double gate transistor with a very thin semiconductor ridge, on one side of which a floating gate electrode and also a control gate electrode are arranged and on the other side of which a further gate electrode is arranged. In the case of this arrangement, the transistor property is determined by both gates. The semiconductor ridge present between the electrodes is fully depleted of charge carriers. If the gates are driven separately, the channel potential is influenced differently from both sides of the semiconductor ridge. On one side of the semiconductor ridge there is a structure of a customary field effect transistor, and on the other side a floating gate transistor that is driven via a control gate. The customary transistor structure is provided for reading from the memory cell; its threshold voltage can be controlled by means of the electrical potential on the gate of the floating gate transistor.

BRIEF DESCRIPTION OF THE DRAWINGS

Examples of a flash memory cell and of a fabrication method are described in more detail below with reference to the accompanying figures.

DETAILED DESCRIPTION OF PREFERRED EMBODIMENTS OF THE INVENTION

Figure 1:
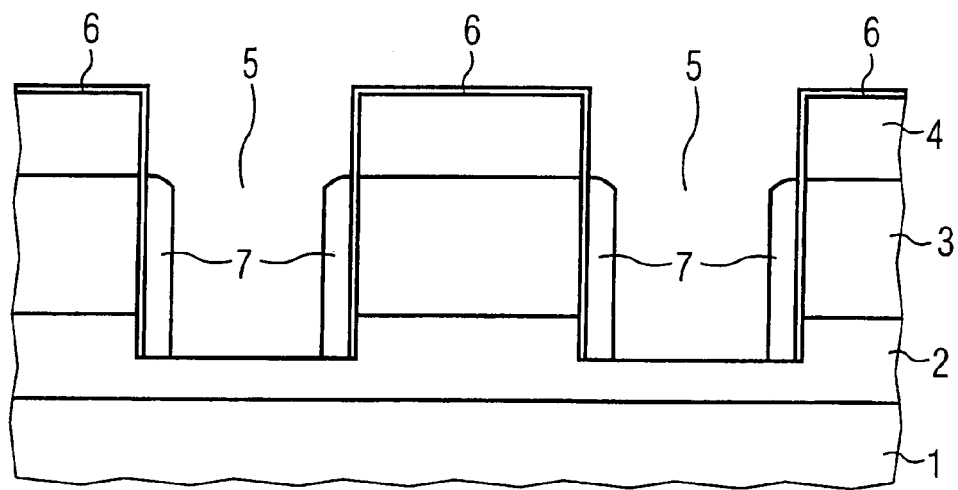
FIGS. 1 to 4 show cross sections through intermediate products of flash memory cells after different steps of a preferred fabrication method.

A description is given below of a preferred exemplary embodiment of the flash memory cell on the basis of a preferred fabrication method. FIG. 1 shows a cross section through an intermediate product after the first steps of the method. An SOI substrate comprising a bulk silicon layer 1, a thin insulation layer 2 made of silicon dioxide and a thin body silicon layer 3 is preferably taken as a basis. Preferably, in this case, firstly an auxiliary layer 4 is applied to the body silicon layer 3, which auxiliary layer may be e.g. silicon nitride. The auxiliary layer 4 is patterned by means of a suitable mask technique, e.g. a photo mask or a resist mask, such that the remaining portions can be used as a mask for etching trenches 5 oriented parallel to one another. The trenches 5 are fabricated with a depth such that the body silicon layer 3 is completely severed by each trench. The trenches are preferably fabricated right into the insulation layer 2 as shown in FIG. 1 in order to obtain a stronger coupling between the floating gate electrode and the control gate electrode. A photoresist that is possibly used is then removed. A plurality of trenches 5 arranged parallel to one another is provided for fabricating not only one flash memory cell but a matrix-like arrangement of a memory cell array.

The first dielectric layer 6 provided as a gate dielectric is subsequently fabricated, preferably an oxide, in particular silicon dioxide, for which purpose the semiconductor material may be oxidized superficially with a small thickness. In this case, it is unimportant whether the first dielectric layer 6 is also applied on the top side of the auxiliary layer 4. The floating gate electrodes 7 are fabricated adjoining the first dielectric layer 6 by a procedure in which firstly the material provided for the floating gate electrodes 7, preferably doped polysilicon, is deposited into the trenches 5. The deposited material is etched back in a manner known per se to form spacer-like portions at the sidewalls of the trenches 5. A further mask provided with openings running transversely with respect to the trenches is used to etch away sections between portions of the order of magnitude of an individual transistor, so that the remaining spacer-like portions provided for the floating gate electrodes are interrupted in sections in the longitudinal direction of the trenches 5, i.e. perpendicularly to the plane of the drawing of FIG. 1.

Figure 2:
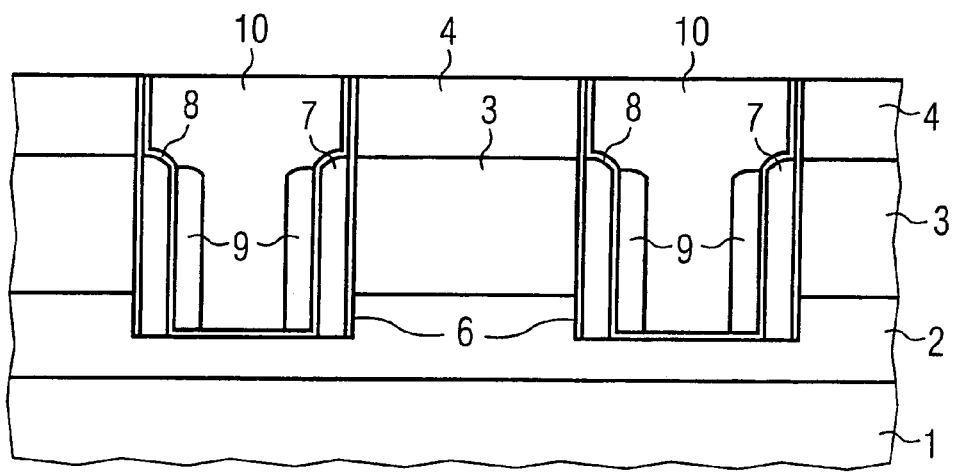

The next method steps lead to the arrangement in accordance with FIG. 2. Firstly, a second dielectric layer 8 is applied and patterned, which is provided as a dielectric between the floating gate electrode and the control gate electrode and is preferably applied as an ONO layer (oxide-nitride-oxide layer) comprising successively $SiO_2$, $Si_3N_4$ and $SiO_2$. The material of the control gate electrodes 9 is then deposited, which is preferably once again doped polysilicon. This material is likewise etched back, but not interrupted in the longitudinal direction of the trenches. The control gate electrodes of the individual memory cells thus remain electrically conductively interconnected along the trenches, with the result that respective word lines of the memory cell array are formed.

The trenches are then filled with a trench filling 10 made of an electrically insulating material, e.g. with silicon dioxide. Before the trench filling is introduced, the polysilicon may be at least partly removed at the ends of the trenches by means of a further mask technique, in order to isolate the individual word lines from one another. The trench filling is planarized on the top side e.g. by means of CMP (chemical mechanical polishing). By means of a further etching step, the auxiliary layer 4 is removed to an extent such that a residual portion of the auxiliary layer in each case remains as a spacer only at the sidewalls of the trench filling 10.

Figure 3:
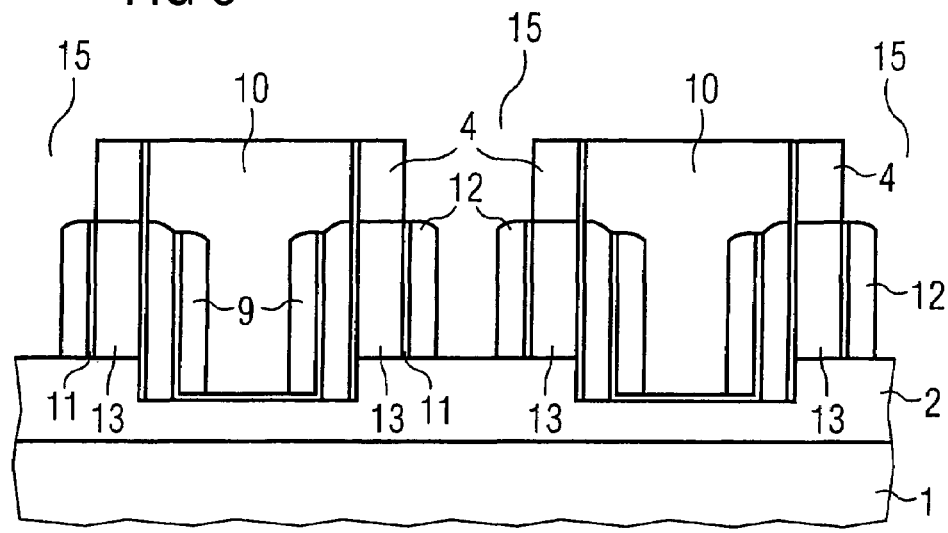

In accordance with the cross section illustrated in FIG. 3, using the residual portions of the auxiliary layer 4 as a mask, further trenches 15 are etched into the body silicon layer 3, the trenches running parallel between the trenches 5 that are already present and filled. The depth of the further trenches 15 reaches only as far as the top side of the insulation layer (2). A third dielectric layer 11, e.g. made of silicon dioxide, is then in each case fabricated at the sidewalls of the further trenches 15. Gate electrodes 12 are fabricated in a manner adjoining the dielectric layer, preferably by doped polysilicon once again being deposited and patterned to form spacer-like portions.

The semiconductor ridges 13 that have remained between the trenches are dimensioned such that it is possible to control the charge carriers in the semiconductor material of the semiconductor ridges 13 from both sides by means of electrical potentials on the control gate electrodes 9 and the gate electrodes 12. The material provided for the gate electrodes 12 is etched away at the ends of the further trenches 15, so that, here as well, the gate electrodes 12 which succeed one another at a respective sidewall of a further trench 15 are electrically conductively interconnected and form mutually isolated further word lines provided for reading the memory cells. The further trenches are also filled with a trench filling 10 that is subsequently planarized.

Figure 4:
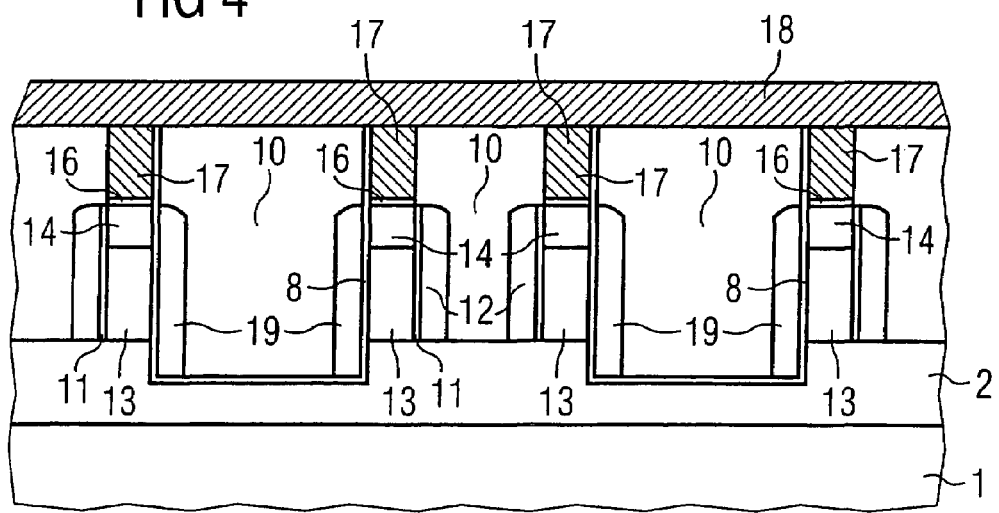

FIG. 4 shows a cross section through the arrangement in the region between the floating gate electrodes where, in this exemplary embodiment, the second dielectric layer 8 is situated directly on the first dielectric layer 6. The intermediate sections 19 of the word lines that connect the control gate electrodes 9 to one another are arranged near the sidewalls of the trenches. In the regions between the floating gate electrodes 7, the portions of the auxiliary layer are removed, and implantations of dopant are introduced into the semiconductor ridges 13 through the resulting openings in order to form doped regions 14 for source and drain. These doped regions 14 are contact-connected through the openings by a procedure in which preferably firstly a diffusion barrier 16 made of titanium and/or titanium nitride is applied and then contact hole fillings 17 e.g. made of tungsten are introduced in a manner known per se. The source and drain regions present in each case on a line running transversely with respect to the longitudinal direction of the trenches are electrically conductively connected to one another by means of a bit line 18 patterned in strip-type fashion on the top side.

Figure 5:
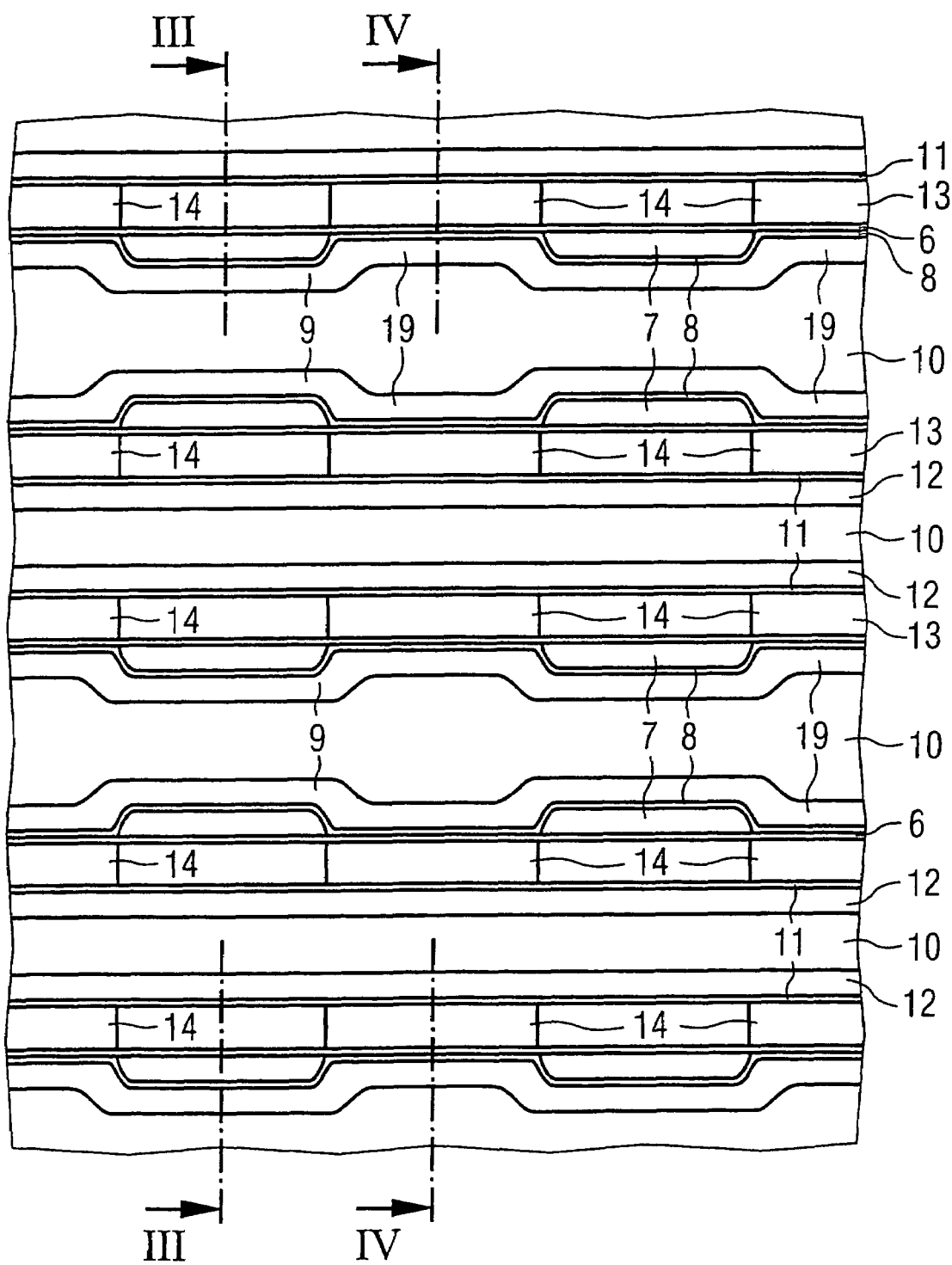
FIG. 5 shows the arrangement of flash memory cells in plan view.

FIG. 5 shows the arrangement of the flash memory cells in a memory cell matrix in plan view. The sectional positions of the cross sections of FIGS. 3 and 4 are specified in FIG. 5. The reference symbols correspond to the reference symbols of the previous figures. It is discernable here that the floating gate electrodes 7 are arranged in each case at the walls of those portions of the semiconductor ridges 13 which lie between two successive doped regions 14, above the channel regions provided there. The control gate electrodes 9 are electrically conductively connected to one another by the intermediate sections 19 to form word lines. An associated gate electrode 12 for driving the channel region on both sides is arranged on the side of a semiconductor ridge 13 that is in each case opposite to the floating gate electrode 7. The bit lines, which are not depicted in this plan view, run on the top side in parallel strips transversely with respect to the longitudinal direction of the trenches, that is to say in each case in perpendicular strips in FIG. 5.

Figure 6:
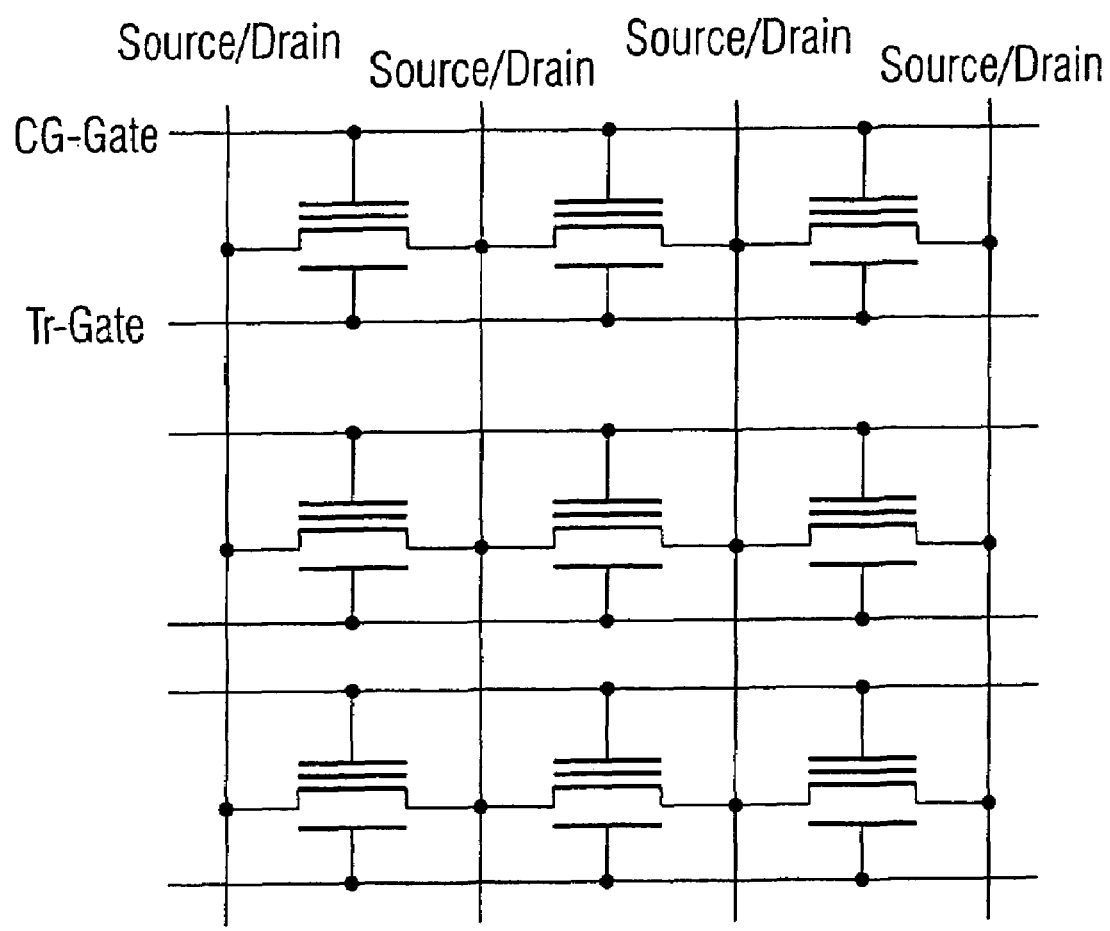
FIG. 6 shows a circuit diagram and also a table of typical electrical potentials for the operation of the circuit.

FIG. 6 illustrates the circuit diagram for this memory cell matrix. Each memory cell is formed by a double gate transistor. The source and drain regions are connected to one another in columns by means of the bit lines running perpendicular in FIG. 6. Instead of a word line, two drive lines are in each case present here in rows, to be precise in each case a line CG-Gate for driving the control gate electrodes and in each case a drive line Tr-Gate for driving the gate electrodes of the customary transistor structures that are opposite to the floating gate electrodes.

A table with suitable and typical voltage values for programming (Prog), erasing (Erase) and reading (Read) the memory cells is specified above the circuit diagram in FIG. 6. The voltage values entered in the table are present respectively at the drain region, at the control gate electrode, at the gate electrode of the customary transistor structure and at the source region. The memory cell matrix represents a "virtual ground" architecture. Dividing the flash memory cells into a read transistor, for which the gate electrodes 12 are provided, and into a programming/erasing transistor, for which the control gate electrodes 9 are provided, has the advantage that the read transistor can be realized with a particularly thin gate oxide (third dielectric layer 11). The read current when reading from the memory cells via the Tr-Gate line is significantly greater than the read current when reading from conventional flash memory cells, thereby enabling a distinct miniaturization of the memory cells.

What is claimed is:

1. A flash memory cell, comprising:
    a first trench formed at a top side of a semiconductor body or a semiconductor layer;
    a floating gate electrode arranged in the first trench isolated from the semiconductor material of a sidewall of the first trench by a first dielectric layer;
    a control gate electrode arranged in the first trench, isolated from the floating gate electrode by a second dielectric layer, and provided with an electrical lead;
    doped regions for source and drain arranged in the semiconductor material forming the sidewall in a longitudinal direction of the first trench at a distance from one another on both sides of the floating gate electrode, the doped regions being provided with contact connections and being electrically conductively connected to a respective bit line;
    a second trench arranged parallel to the first trench and at a distance from the sidewall provided with the floating gate electrode, so that a semiconductor ridge is present between the first and second trenches; and
    a gate electrode arranged in the second trench on a sidewall of the semiconductor ridge opposite the floating gate electrode, isolated from the semiconductor material by a third dielectric layer, and provided with an electrical lead.

2. An arrangement of flash memory cells as claimed in claim 1, wherein:
the flash memory cells form a matrix arrangement of a semiconductor memory in a virtual ground architecture,
the doped regions for the sources and the drains are in each case electrically conductively connected to one another in a column of the matrix arrangement,
the control gate electrodes, which are present in a row of the matrix arrangement in the respective first trenches, are electrically conductively connected to one another, and
the gate electrodes, which are opposite the floating gate electrodes of the row of control gate electrodes that are electrically conductively connected to one another, are likewise electrically conductively connected to one another.

3. The arrangement as claimed in claim 2, wherein both sidewalls of the respective first trenches are provided with floating gate electrodes and control gate electrodes, and
wherein the second trenches with the respective gate electrodes arranged opposite to the respective floating gate electrodes are present on both sides of the respective first trenches.

4. A method for fabricating a flash memory cell, comprising the steps of:
(a) fabricating a first trench at a top side of a semiconductor body or a semiconductor layer;
(b) applying a first dielectric layer, which is provided as a gate dielectric, at least to a sidewall of the first trench, and applying and patterning a floating gate electrode thereto;
(c) applying a second dielectric layer to the floating gate electrode, and applying a control gate electrode to the second dielectric layer;
(d) filling the first trench with an electrically insulating trench filling;
(e) fabricating a second trench on each side of the first trench, at a distance from and parallel to the first trench;
(f) applying in the second trench a third dielectric layer on a sidewall of the second trench opposite the floating gate electrode, and applying a gate electrode to the dielectric layer; and
(g) filling the second trench with an electrically insulating trench filling, and implanting dopant to form doped regions for source and drain in sections into the semiconductor body or semiconductor layer between the first and second trenches.

5. The method as claimed in claim 4, before step (a), further comprising the steps of:
applying an auxiliary layer to the top side of the semiconductor body or the semiconductor layer;
patterning the auxiliary layer in each case as a mask to fabricate the first trench; and
at least partly fabricating the second trench before the implantation of dopant.

6. The method as claimed in claim 4, wherein step (a) comprises the steps of:
taking as a basis an SOI substrate comprising a bulk silicon layer, a thin insulation layer made of silicon dioxide, and a thin body silicon layer; and
fabricating the first trench to sever the silicon layer and into the insulation layer.

7. A flash memory cell, comprising:
a first trench formed at a top side of a semiconductor body or a semiconductor layer;
a floating gate electrode arranged in the first trench isolated from the semiconductor material of a sidewall of the first trench by a first dielectric layer;
a control gate electrode arranged in the first trench, isolated from the floating gate electrode by a second dielectric layer, and provided with an electrical lead;
doped regions for source and drain arranged in the semiconductor material forming the sidewall in a longitudinal direction of the first trench at a distance from one another on both sides of the floating gate electrode, the doped regions being provided with contact connections and being electrically conductively connected to a respective bit line;
a second trench arranged parallel to the first trench and at a distance from the sidewall provided with the floating gate electrode, so that a semiconductor ridge is present between the first and second trenches; and
a gate electrode arranged in the second trench on a sidewall of the semiconductor ridge opposite the floating gate electrode, isolated from the semiconductor material by a third dielectric layer, and provided with an electrical lead,
wherein the semiconductor ridge is dimensioned such that charge carriers in the semiconductor ridge can be controlled from both sides of the ridge by means of electric potentials on the control gate electrode and the gate electrode.

* * * * *

UNITED STATES PATENT AND TRADEMARK OFFICE
CERTIFICATE OF CORRECTION

PATENT NO. : 6,979,859 B2
DATED : December 27, 2005
INVENTOR(S) : Franz Hofmann et al.

It is certified that error appears in the above-identified patent and that said Letters Patent is hereby corrected as shown below:

<u>Title page,</u>
Item [73], Assignee, delete "Infenion Technologies AG, Munich (DE)" and substitute
-- Infineon Technologies AG, Munich (DE) --.

Signed and Sealed this

Twenty-first Day of March, 2006

JON W. DUDAS
*Director of the United States Patent and Trademark Office*